United States Patent
Booth et al.

(10) Patent No.: US 8,803,072 B2
(45) Date of Patent: Aug. 12, 2014

(54) METHOD AND DEVICE FOR ACCURATELY MEASURING THE INCIDENT FLUX OF AMBIENT PARTICLES IN A HIGH OR ULTRA-HIGH VACUUM ENVIRONMENT

(75) Inventors: James Lawrence Booth, Burnaby (CA); David Erik Fagnan, Kitchener (CA); Bruce George Klappauf, Vancouver (CA); Kirk William Madison, Vancouver (CA); Jicheng Wang, Harbin (CN)

(73) Assignee: British Columbia Institute of Technology, Burnaby, British Columbia (CA)

( * ) Notice: Subject to any disclaimer, the term of this patent is extended or adjusted under 35 U.S.C. 154(b) by 548 days.

(21) Appl. No.: 13/116,982

(22) Filed: May 26, 2011

(65) Prior Publication Data

US 2011/0290991 A1   Dec. 1, 2011

Related U.S. Application Data

(60) Provisional application No. 61/348,403, filed on May 26, 2010.

(51) Int. Cl.
| | |
|---|---|
| *G21K 1/00* | (2006.01) |
| *G01L 27/00* | (2006.01) |
| *H05H 3/04* | (2006.01) |
| *G01L 21/00* | (2006.01) |
| *C23C 14/22* | (2006.01) |
| *C30B 23/00* | (2006.01) |
| *C23C 14/54* | (2006.01) |

(52) U.S. Cl.
CPC ............. *C23C 14/221* (2013.01); *G01L 21/00* (2013.01); *G01L 27/005* (2013.01); *C30B 23/005* (2013.01); *C23C 14/544* (2013.01); *G21K 1/006* (2013.01)
USPC ............. 250/251; 324/71.3; 73/1.57; 73/1.58

(58) Field of Classification Search
USPC ................... 250/251; 324/71.3; 73/1.57, 1.58
See application file for complete search history.

(56) References Cited

U.S. PATENT DOCUMENTS 5,274,231 A * 12/1993 Chu et al. ............... 250/251
7,915,577 B2 * 3/2011 Fatemi et al. ............ 250/251

OTHER PUBLICATIONS

Matherson et al., Absolute metastable atom-atom collision cross section measurements using a magneto-optical trap, Review of Scientific Instruments, 78, 073102 (2007).*
Stanford Research Systems, Gas Correction Factors for Bayard-Alpert Ionization Gauges, Stanford Research Systems Application Notes, http://www.thinksrs.com/downloads/PDFs/ApplicationNotes/IG1BAgasapp.pdf.
C. Monroe et al., Very Cold Trapped Atoms in a Vapor Cell, Physical Review Letters, Sep. 24, 1990, 1571-75, 65(13).
C. R. Tilford et al., Comments on the Stability of Bayard-Alpert Ionization Gages, J. Vac. Sci. Technol. A, Mar.-Apr. 1995, 485-87, 13(2).

(Continued)

*Primary Examiner* — Jack Berman
(74) *Attorney, Agent, or Firm* — Ryan W. Dupuis; Kyle R. Satlerthwa; Ade & Company Inc.

(57) ABSTRACT

An apparatus and method that can measure flux density in-situ under high vacuum conditions includes a means for confining a collection of identical, elemental sensor particles to a volume of space by initial cooling by laser or another method, then confinement in a sensor volume using externally applied magnetic and/or optical fields.

21 Claims, 4 Drawing Sheets

(56) References Cited

OTHER PUBLICATIONS

D. E. Fagnan et al., Observation of Quantum Diffractive Collisions Using Shallow Atomic Traps, Physical Review A, 2009, 1-8, 80.

D. G. Bills, Causes of Nonstability and Nonreproducibility in Widely Used Bayard-Alpert Ionization Gauges, J. Vac. Sci. Technol. A, Mar.-Apr. 1994, 574-79, 12(2).

K. Jousten et al., Comparison of the Standards for High and Ultrahigh Vacuum at Three National Standards Laboratories, J. Vac. Sci. Technol. A, Jul.-Aug. 1997, 2395-406, 15(4).

K. Matherson et al., Measurement of Low-Energy Total Absolute Atomic Collision Cross Sections with the Metastable 3P2 State of Neon Using a Magneto Optical Trap, Physical Review A, 2008, 1-5, 78.

M. Prentiss et al., Atomic-Density-Dependent Losses in an Optical Trap, Optical Letters, Jun. 1988, 452-54, 13(6).

P. C. Arnold et al., Stable and Reproducible Bayard-Alpert Ionization Gauge, J. Vac. Sci. Technol. A, Mar.-Apr. 1994, 580-86, 12(2).

P. C. Arnold et al., Nonstable Behavior of Widely Used Ionization Gauges, J. Vac. Sci. Technol. A, Mar.-Apr. 1994, 568-73, 12(2).

B. R. F. Kendall, Ionization Gauge Errors at Low Pressures, J. Vac. Sci. Technol. A, Jul.-Aug. 1999, 2041-49, 17(4).

* cited by examiner

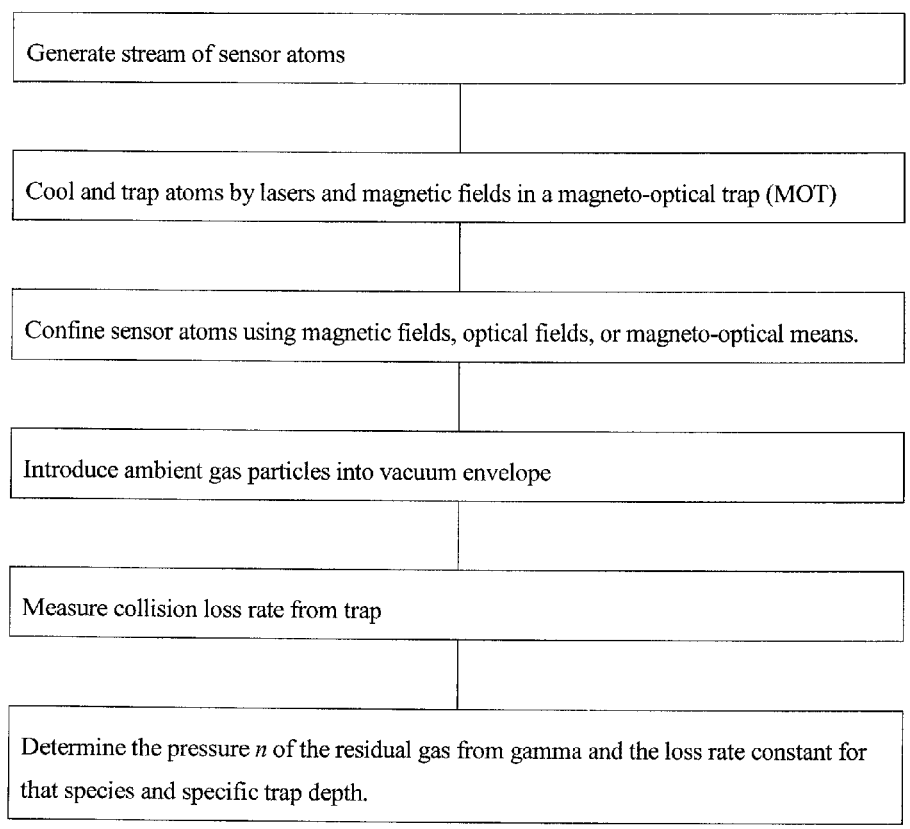

METHOD AND DEVICE FOR ACCURATELY MEASURING THE INCIDENT FLUX OF AMBIENT PARTICLES IN A HIGH OR ULTRA-HIGH VACUUM ENVIRONMENT

FIELD OF THE INVENTION

The invention relates generally to an apparatus and method for measuring the flux of particles and/or the density of particles in a vacuum, particularly a high or ultra-high vacuum environment.

BACKGROUND OF THE INVENTION

Molecular beam epitaxy (MBE) is a thin film deposition technique for depositing single-crystal semiconducting, insulating or metallic materials used in state-of-the-art electronic and opto-electronic devices. A material is grown by directing the output of effusion cells onto a heated substrate in an ultra high vacuum (UHV) chamber, at pressures as low as $10^{-10}$ Torr.

Most MBE applications require accurate control over the particle fluxes, and methods for continuous or periodic recalibration of the flux are necessary. Current generation MBE machines do not have accurate and immutable control of growth rates and composition of the deposited material because they rely on pre-growth calibrations of the beam flux using inaccurate and insensitive flux detectors that are themselves subject to calibration drift.

The most common method of flux monitoring in MBE involves the ionization of the particles in the beam flux and the detection of the number of those ions produced. For example, an ionization gauge can be used to measure the beam equivalent pressure (BEP) of each beam flux when run individually. However, ion gauges are typically not sensitive enough to measure doping fluxes accurately. Increased sensitivity and mass selectivity can be achieved by the use of, for example, a quadrupole mass filter followed by an avalanche electron multiplier. However these devices do not offer the required reproducibility in many cases. The primary problem for these types of detectors is that the calibration factor between the BEP and the actual particle flux in the beam changes over time because of detector sensitivity changes due to changes in the geometry of the sensor (the position of the filament with respect to the grid) or due to contamination and damage resulting from the exposure to background gasses or the particle beam being measured. For this reason, these devices require regular calibrations against actual measurements of thin film thickness and composition.

Another flux measurement device is the quartz crystal oscillator. Its operation relies on the measurement of the change in its oscillation frequency as it becomes loaded with particle deposit from the beam being measured. These oscillators provide a measure of the total thickness of the deposited material and the particle flux is determined by the time rate of change in this thickness. Quartz crystal oscillators have much lower sensitivity than ionization gauges, and they exhibit a variable sensitivity, a limited lifetime and reproducibility due to crystal overloading. Crystal overloading presents a significant limitation particularly for silicon deposition.

A third flux detection method involves electron-induced emission detection in which the particles in the flux are excited by bombardment with an electron beam and the subsequent photo-emission from the particles provides a measure of their number. As with quartz crystal oscillators, these detectors have a limited sensitivity and must be placed close to the beam source for adequate signal strength. In addition, they need to be calibrated against the actual thickness of deposited epilayers. Finally, they must be re-calibrated if the detector is moved or if the electron filament is replaced.

The beam flux can be also be inferred from measurements of the epilayer thickness using reflection high energy electron diffraction (RHEED). However, RHEED is not sensitive enough to measure doping fluxes, and it can result in kinetic damage to the surface and carbon contamination in certain materials. These limitations are described in more detail in *Molecular Beam Epitaxy: Applications to Key Materials*, edited by Robin F. C. Farrow, Noyes Publications, New Jersey, USA (1995); pages 76-86.

In addition to beam flux measurements in MBE applications, ionization based detectors (ionization gauges and residual gas analyzers) are commonly used to provide measurements of the vapor pressure of gases in ultra-high vacuum. Electrons are emitted from an emission source (such as a hot filament) and ionize particles which enter the detector volume. The resulting ions are collected on a grid and the residual gas density, or pressure, is inferred from the ratio of the ion current to the electron emission current.

These ion gauge type sensors have numerous disadvantages, as disclosed in multiple references (P. C. Arnold and S. C. Borichevsky, *Nonstable behavior of widely used ionization gauges*, J. Vac. Sci. Technol. A 12, 568 (1994); D. G. Bills, *Causes of nonstability and nonreproducibility in widely used Bayard-Alpert ionization gauges*, J. Vac. Sci. Technol. A 12, 574 (1994); P. C. Arnold, D. G. Bills, M. D. Borenstein, and S. C. Borichevsky, *Simple and reproducible Bayard-Alpert ionization gauge*, J. Vac. Sci. Technol. A 12, 580 (1994), C. R. Tilford, A. R. Filippelli, and P. J. Abbott, *Comments on the stability of Bayard-Alpert ionization gages*, J. Vac. Sci. Technol. A 13, 485 (1995), and K. Jousten, A. R. Filippelli, C. R. Tilford, and F. J. Redgrave, *Comparison of the standards for high and ultrahigh vacuum at three national standards laboratories*, J. Vac. Sci. Technol. A 15, 2395 (1997).). The primary limitation is that the particle ionization efficiency depends on the particle species and on the precise geometry of the electron emitter and ion collector. For this reason, these devices require calibration for accurate measurements and they suffer from calibration drift due to changes in the tube ionization efficiency (from electron filament or ion collector sag). These devices include hot electron emission filaments that produce a variety of contaminant gases during operation that change and in some cases degrade the vacuum it is intended to measure. The ultimate sensitivity and accuracy of such gauges is limited by outgassing of the components and leakage current not associated with the presence of ionized background gas, both of which can change with the age of the detector.

Accordingly, a need exists for an improved method and device for measuring, with accuracy and precision, the flux from effusion cells in MBE systems. It would be even more advantageous if said method and device could be used for measuring the ambient density of any gas in any high or ultra-high vacuum system, allowing it to be used directly as a pressure sensor or as a calibration standard for other pressure sensors.

While the loss of particles (atoms and molecules) from confining potentials (magnetic or optical) due to interactions (collisions) with un-trapped particles residing in the ultra-high vacuum environment is a known empirical phenomenon, the actual use of these losses to accurately determine the absolute flux of particles into the trap volume has never been done. This is, in part, due to a variety of reasons including the non-obvious dependence of the trap loss rate on the interaction potentials, on the internal state of the trapped particle, and on the depth of the confining potential.

The present invention mitigates and/or obviates the above-noted disadvantages. In particular, the present invention discloses an apparatus and method to achieve accurate beam flux or ambient gas density determination from measurements of the particle loss rate from a trap.

SUMMARY OF THE INVENTION

The present invention provides a method and apparatus for measuring the incident flux of particles in any vacuum environment. It is of particular use and benefit in high or ultra-high vacuum environments.

The present invention provides an apparatus that measures flux density in-situ under high vacuum conditions which comprises a means for confining a collection of identical, elemental sensor particles to a volume of space by initial cooling by laser or another means, means of confinement in a sensor volume using externally applied magnetic and/or optical fields and a means of measuring the loss rate of the sensor particles after interactions with particles from an incident flux.

The incident flux density of ambient particles can be accurately determined from the sensor particle loss rate, the interaction potential between the sensor particles and the particles being measured, and knowledge of the confining potential for the sensor particles.

The cold atom-based pressure sensor described herewith provides a means of measuring the absolute pressure of any residual gas based on a fundamental physical process, namely momentum exchanging collisions with fast moving particles. Therefore, it can serve as an absolute pressure standard to calibrate other gauges.

As such, in one aspect, the present invention provides an apparatus which achieves the following functionality:
(a) provides a sensor vacuum envelope;
(b) generates sensor atoms;
(c) introduces said sensor atoms into the vacuum envelope;
(d) cools and collects said sensor atoms in a magneto-optic trap (MOT)
(e) transfers said sensor atoms into the sensor trap volume provided by an optical or magnetic trap;
(f) introduces the particles to be measured into said vacuum envelope such that the particles interact with said sensor atoms; and
(g) measures the sensor atom loss rate from the sensor volume Further, in another aspect, the present invention provides a method for measuring the incident flux of particles in a vacuum environment, comprising:
(a) introducing at least one sensor atom, comprising an alkali-metal vapor, into the test vacuum environment and sensor volume;
(b) collecting and confining said sensor atoms inside the sensor volume;
(c) introducing the particle flux to be measured into the sensor volume;
(d) monitoring characteristics of the sensor atoms selected from the group consisting of the number of sensor atoms and the internal state of the sensor atoms, within the sensor volume during a measurement time; and
(e) determining the incident particle flux through the sensor volume from said measurements of said sensor atoms.

The method and device of the present invention may be beneficially directed to thin film deposition systems and additionally to vacuum gauge calibration systems. In addition to its use as a pressure or flux measurement device, this invention can also be used to create a desired absolute pressure or flux of particles. This is useful in MBE applications where the control of atomic or molecular beam sources to output a precise and absolute particle flux is essential to the creation of high quality epitaxial materials.

As such, the invention disclosed herein provides a novel, in-situ measurement of the particle flux with a very high degree of precision and accuracy based on the unchanging interactions between the sensor particles and the particles comprising the flux in a Molecular Beam Epitaxy machine.

BRIEF DESCRIPTION OF THE DRAWINGS

The following figures set forth embodiments of the invention in which like reference numerals denote like parts. Embodiments of the invention are illustrated by way of example and not by way of limitation in the accompanying figures and description of the preferred embodiments which follow wherein:

FIG. 5 is a logical flow chart of a method embodiment of measuring in-situ molecular flux density or pressure according to some embodiments of the present invention.

DETAILED DESCRIPTION OF THE PREFERRED EMBODIMENT

Figure 1A:
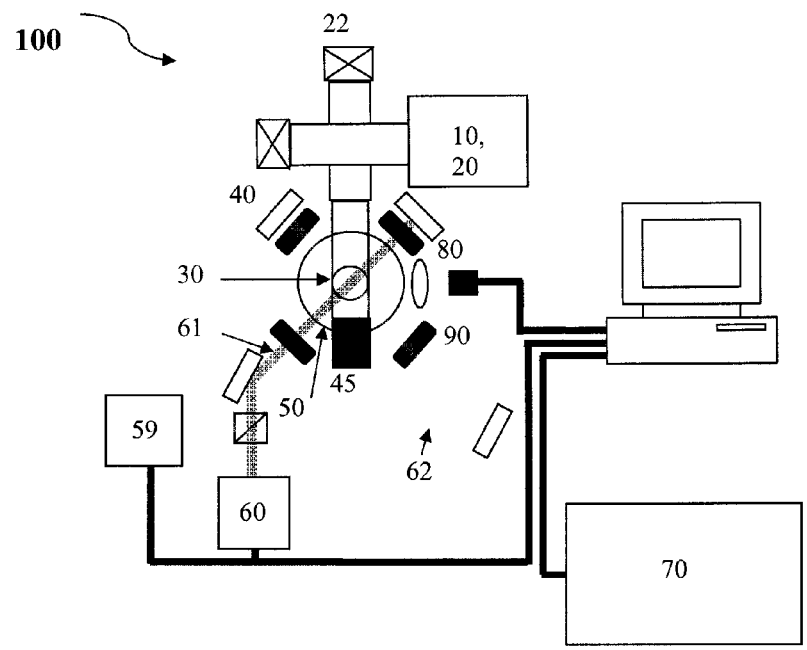
FIG. 1 is a schematic representation of a pressure measurement apparatus, in top view (FIG. 1A) and isometric view (FIG. 1B)

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As used herein, the terms "apparatus" and "device" may be used interchangeably.

As used herein, the abbreviation MBE means "Molecular Beam Epitaxy, which is a thin film deposition technique for depositing single-crystal semiconducting, insulating or metallic materials used in state-of-the-art electronic and optoelectronic devices.

In a broad sense, the present invention relies on creating a collection of sensor atoms that are spatially confined in a trap, and then measuring the interaction between these sensor particles and incident particles (in a beam flux or in the ambient vapor) that interact with said sensor atoms.

In the literature (for example, Harold. J. Metcalf and Peter van der Straten, *Laser Cooling and Trapping*, Springer Verlag, New York, USA (1999); ISBN 0-387-98728-2; QC689.5.L35 M47 1999; (See p. 138.), M. Prentiss, A. Cable, J. E. Bjorkholm, S. Chu, E. L. Raab, and D. E. Pritchard, *Atomic-density-dependent losses in an optical trap*, Optics Letters 13, 452 (1988), C. Monroe, W. Swann, H. Robinson, and C. Wieman, *Very Cold Trapped Atoms in a Vapour Cell*, Physical Review Letters 65, 1571 (1990), and K. J. Matherson, R. D. Glover, D. E. Laban, and R. T. Sang, *Measurement of low-energy total absolute atomic collision cross sections with metastable $^3P_2$ state of neon using a magneto-optical trap*, Physical Review A PRA 78, 042712-1-042712-5 (2008).), it is well known that the loss rate of laser cooled atoms from traps is related to the residual or ambient gas pressure. It is known that a residual background pressure of $10^{-8}$ Torr approximately corresponds to a loss rate of $1\ s^{-1}$ from a magneto-optical trap or "MOT". Without being limited in any respect, it has been determined, within the scope of the present invention, that this "rule-of-thumb" is inaccurate because it neglects the very important role of the trap depth or confinement potential and the interaction potential between the sensor particles and the particles being measured.

The present invention provides a method and apparatus for the accurate and substantially precise determination of the incident particle flux in a preferably high or ultra-high vacuum environment based on a measurement of their collisions with a single "sensor" atom or a collection of sensor atoms. Preferably, the sensor atoms are laser cooled and spatially confined in a magnetic or optical trap. The passage of a particle through the sensor volume is heralded by either the change of internal state of the sensor atom or by the loss of a sensor atom resulting from the sensor-particle interactions. The rate of change or rate of loss provides information on the flux of particles through the sensor volume.

A method and apparatus for the preparation and measurement of the sensor atoms and for the precise and accurate determination of the particle flux from said measurements is provided. Detected particles that interact with said sensor atoms can be ambient gases, neutral atoms or molecules in a beam, charged particles such as electrons, ions, a plasma, or electro-magnetic radiation (photons). The method and apparatus disclosed provides an accurate and unchanging determination of particle flux for many purposes including the accurate calibration of vacuum gauges, residual gas analyzers, and flux sensors used for materials fabrication. This method and apparatus also provide for the establishment of a pressure standard in the range from $10^{-5}$ to $10^{-9}$ Pa. The method and apparatus disclosed confines the sensor atoms to a small volume and hence provides the ability to measure the particle flux through a small area (<$mm^2$). This enables the determination of the spatial profile of particle flux including the profile of an atomic beam in a Molecular Beam Epitaxy (MBE) fabrication apparatus.

In one embodiment of the present invention, there is provided an apparatus which comprises:
(a) a sensor vacuum envelope;
(b) a means to generate sensor atoms;
(c) a means to introduce the sensor atoms into the vacuum envelope;
(d) a means to cool and collect the sensor atoms in a magneto-optic trap (MOT);
(e) a means to transfer the sensor atoms into the sensor trap volume provided by an optical or magnetic trap;
(f) means to introduce the particles to be measured into said vacuum envelope such that the particles interact with said sensor atoms; and
(g) a means to measure the sensor atom loss rate from the sensor volume.

In a preferred form, the sensor vacuum envelope can be integrated together with the vacuum envelope under test. In a preferred form, the sensor atoms are alkali-metal atoms selected from the group consisting of lithium, sodium, potassium, rubidium, or cesium atoms. In a preferred form, the sensor atoms are introduced into the sensor volume by the use of an alkali-metal vaporizer to provide an alkali-metal vapor inside said sensor volume.

In a preferred form, the sensor atoms are collected and cooled using a magneto-optic trap (MOT), comprising;
(a) a laser system and associated optics capable of delivering cooling radiation sufficient to Doppler cool the alkali-metal sensor atoms.
(b) a set of magnetic coils or permanent magnets arranged to provide a magnetic field gradient sufficient to complete the operation of the MOT providing both cooling and spatial confinement of the sensor atoms.

In a preferred form, the said sensor atoms are transferred into a spatially localized sensor volume determined by the magnetic or electro-magnetic field generated by either
(a) a set of magnetic coils or permanent magnet system in the proper arrangement to provide a magnetic field gradient sufficiently large to confine the cold sensor atoms to the sensor volume
(b) a laser system capable of delivering radiation sufficient to trap the cold sensor atoms to the sensor volume.

In a preferred form, the particles to be measured are allowed, by means of a vacuum valve, to enter into and impinge upon the sensor volume such that the particles interact with said sensor atoms. In a preferred form, the sensor particle number inside the sensor volume is measured by a fluorescence detection device comprising;
(a) a photodiode, photodetector, CCD camera, or CMOS camera.
(b) a laser system and associated optics capable of delivering cooling radiation sufficient to Doppler cool the alkali-metal sensor atoms.

In a preferred form, the laser system provides near resonant light sufficient to excite the sensor atoms so that their fluorescence is detectable. In a most preferred form, the apparatus includes a computer or electronic system to control and monitor the sensor atoms in the sensor volume.

In another embodiment of the present invention, there is provided a method for measuring the incident flux of particles in a vacuum environment, comprising:
(a) introducing at least one sensor atom, comprising an alkali-metal vapor, into the test vacuum environment and sensor volume;
(b) collecting and confining said sensor atoms inside the sensor volume;
(c) introducing the particle flux to be measured into the sensor volume;
(d) monitoring characteristics of the sensor atoms selected from the group consisting of the number of sensor atoms and the internal state of the sensor atoms, within the sensor volume during a measurement time; and
(e) determining the incident particle flux through the sensor volume from said measurements of said sensor atoms.

In a preferred form, said sensor atoms are introduced into said sensor volume at a controlled rate such that they can be collected, cooled, and confined in a magneto-optic trap and transferred to the sensor volume trap. In a preferred form, the method further comprises the step of temporarily isolating the sensor atoms in the sensor volume from the sensor atom source and allowing said confined sensor atoms to interact with the particles to be measured.

In a preferred form, the characteristics of the sensor atoms are measured by detecting the intensity of resonance fluorescence from the atoms during the measurement time or measured at the beginning and at the end of the measurement time.

In a preferred form, the flux of particles through the sensor volume is determined from the change in the number or internal quantum state of the sensor particles remaining in the sensor volume, comprising:
(a) the measurement of the loss rate of sensor particles from the sensor volume under different confinement conditions comprising different trap depths for the sensor particles;
(b) the division of the said measured loss rate of sensor particles by the numerically computed expected velocity averaged cross section at the corresponding sensor particle trap depth given the sensor particle species and the particle species being measured; and
(c) the inversion of a set of linear equations for the expected loss rate as a function of sensor particle trap depth given a flux comprised of a collection of different particle species.

With reference to the figures, apparatus is illustrated generally in FIG. 1 as 100. A vacuum envelope consists of a glass cell (30) where the sensor particles are trapped, and attached, via a glass to metal seal, to a standard 6-way conflat cross. The envelope may be a stand-alone device designed to mate with the system whose pressure is to be measured via a valve (22), such as a thin film deposition (MBE) system, or it may be fully integrated into an existing test chamber. Ultra high vacuum (UHV) conditions are maintained through the use of an ion pump or a turbo-molecular pump (10) and chemical getter pumps (20). To function, the background residual gas pressure in the vacuum envelope should be below $10^{-7}$ Torr.

For optimal results, sensor atoms with extremely low vapor pressures at ambient temperature are preferably used, to avoid changing or degrading the vacuum. Lithium or rubidium atoms are suitable for this purpose as lithium has an exceedingly low vapor pressure of $10^{-20}$ Torr at room temperature. When lithium or rubidium atoms are lost from the trap, they stick to the walls and do not enter the vapor phase again.

The sensor atoms are dispensed into the envelope by heating either a commercial alkali source (45) or a custom-built oven containing the specific sensor atoms. Once introduced, these atoms are then laser cooled using a conventional alkali cooling method, described below. A frequency stabilized diode laser (59) is locked at a frequency that is lower in frequency (red-detuned) than light exactly on resonance for a stationary atom on the $n^2S_{1/2}$ F=I+J to $n^2P_{3/2}$ F'=I'+J' transition. For example, in rubidium-87, or $^{87}$Rb, this transition is the $5^2S_{1/2}$ F=2 to $5^2P_{3/2}$ F'=3 transition. Typical detunings range from one to several natural linewidths for the specific transition which correspond to detunings of about 10 to 30 MHz.

Figure 1B:
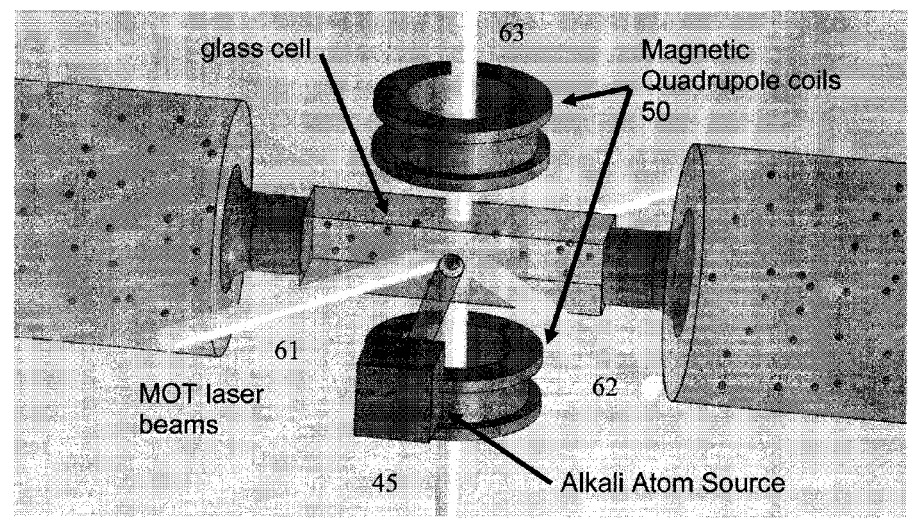

This frequency stabilized light is split into three beams (61, 62, and 63) of equal power for a retroreflection MOT (FIGS. 1A and 1B). The beams are sent along three mutually orthogonal directions (for example, one vertically, and two perpendicular directions horizontally), overlapping in the vacuum envelope. When atoms enter the volume defined by the laser beams, the exchange of photons through absorption and spontaneous emission results, on average, in the reduction of the atoms' momentum. As the absorption and spontaneous emission process is very rapid, many millions of photons can be absorbed and re-emitted per second resulting in significant deceleration of the sensor atoms within the laser overlap volume. The result of this deceleration is to create an ensemble of slowly moving or "cold" atoms.

In order to trap and hold the atoms in a specific region in space, there are two further considerations. First, the atomic energy level structure has several closely spaced hyperfine energy levels in the excited and ground electronic states. When the atoms absorb laser photons, there is a small probability that the atoms will spontaneously emit a photon and decay into a different ground hyperfine state (F=I+J−1) instead of the desired cooling state (F=I+J). Even though this is a small probability, given the large number of photon absorptions in the laser trapping volume, this loss to the lower hyperfine state occurs with certainty over time. Once atoms have made the transition to this lower state, they are no long resonant with the laser fields and will rapidly drop out of the laser cooling volume. To compensate for this loss mechanism, a second laser beam is preferably introduced into the laser cooling volume. This second laser, called the repump laser (60), is frequency stabilized to be resonant with the $n^2S_{1/2}$ F=I+J−1 to the $n^2P_{3/2}$ F'=I+J'−1 atomic transition. (e.g. for $^{87}$Rb, this corresponds to the $5^2S_{1/2}$ F=1 to $5^2P_{3/2}$ F'=2 transition.) The repump beam is much weaker than the cooling laser beams and can be arranged to be either co-linear with the cooling laser or can it be directed into the laser cooling volume from any direction as a single, low power laser beam. It is advantageous and preferred to arrange collinear beams for this application. Mixing of the two beams through a polarization-dependent beam-splitter cube yields orthogonal circular polarizations between the cooling laser and repump laser beams. With this arrangement of polarizations, atoms being transferred from a magneto-optical trap to a magnetic trap are preferentially distributed among atomic states that are readily held in the magnetic trap.

The second issue that is addressed relates to the fact that laser cooling will simply slow the atoms down but not provide spatial confinement of the cold atoms. That is, the slowed atoms will diffuse out of the laser cooling volume and drift away rapidly. To create a trap for the sensor atoms, their magnetic properties are exploited. The alkali atoms commonly used for laser cooling and trapping have atomic states that are diamagnetic. That is, states whose energy increases with magnetic field. Atoms in diamagnetic energy states will migrate to regions where there is a minimum in the local magnetic induction field (and, therefore, are called weak-field seeking states). The cooling and repump laser beams push the atoms into these diamagnetic atomic states by design. An inhomogeneous magnetic induction field is overlaid on the laser cooling volume and the slowed atoms are then driven to the minimum of the magnetic field, creating the magneto-optical trap.

In the apparatus shown in the figures, a pair of electromagnetic quadrupole coils (50) are placed outside the vacuum envelope, with the vertical laser beam passing through their centre. The magnetic coils are arranged to be separated by half their radius and current flows through them in opposite directions to create a magnetic quadrupole field. The current is controlled via a power supply (70).

The main characteristic of this quadrupole field is that the magnetic induction field produced is zero at the midpoint between the two coils and the field increases linearly away from the centre. The field gradient along the vertical direction is twice the magnetic field gradient along the horizontal directions. The zero of the field provides a local energy minimum for the atoms in the diamagnetic states, creating a spatially dependent force that traps the slowly moving atoms. The typical vertical magnetic field gradients used range from approximately 10 G/cm up to 30 G/cm.

The final optical components that are required for the magneto-optical trap are quarter-wave retardation plates (also called retarder plates) (90) which produce circularly polarized cooling laser light. The lasers (cooling laser (59) and repump laser (60)) are introduced along three mutually perpendicular directions, as more clearly shown in FIG. 1A. The lasers pass through the quarter-wave plates (90) to provide the correct polarization for cooling and trapping sensor atoms produced by the dispenser. These laser beams are retroreflected through quarter-wave plates and mirrors (40) to provide sensor atom cooling.

These retarder plates are oriented to ensure that the cooling laser beams interact with the atoms to drive specific diamagnetic state transitions: $n^2S_{1/2}|F\ F>$ to $n^2P_{3/2}|F'\ F'>$ within the trapping volume. The orientation of the retarder plates (right circularly polarized or left circularly polarized) is dictated by the direction of the magnetic induction field produced by the anti-Helmholtz coils. That is, with one direction of the magnetic induction field, the horizontal laser beams are made to be right circularly polarized and the vertical laser beams are left circularly polarized. These polarizations reverse with the magnetic induction field direction. The interaction of the atoms with the magnetic field and the polarized laser beams provides a spatially dependent radiation pressure that provides the trapping in a MOT.

Finally, a lens and a photodetector (80) are included to measure the fluorescence emitted by the sensor atoms that are in the trap. The data acquisition, the lasers, and the current to the coils are controlled by a computer.

Alternatively, the sensor particles can be transferred to a separate optical or pure magnetic trap after the initial laser cooling.

An optical trap uses an intense laser beam, whose frequency is preferably very far below any atomic resonances (i.e. far red-detuned) that is focused down to a spot size of a few tens of microns. This beam is placed in close proximity to the atoms in the MOT and the slowly moving atoms are then transferred to this optical trap.

In a pure magnetic trap, the sensor particles are confined due to the magnetic moment of the quadrupole (anti-Helmholtz) coils. The current in the magnetic coils is increased from 10 G/cm used in the MOT up to a final gradient that can range from 12 G/cm up to several hundred G/cm, depending on the desired depth of the trap.

Figure 2:
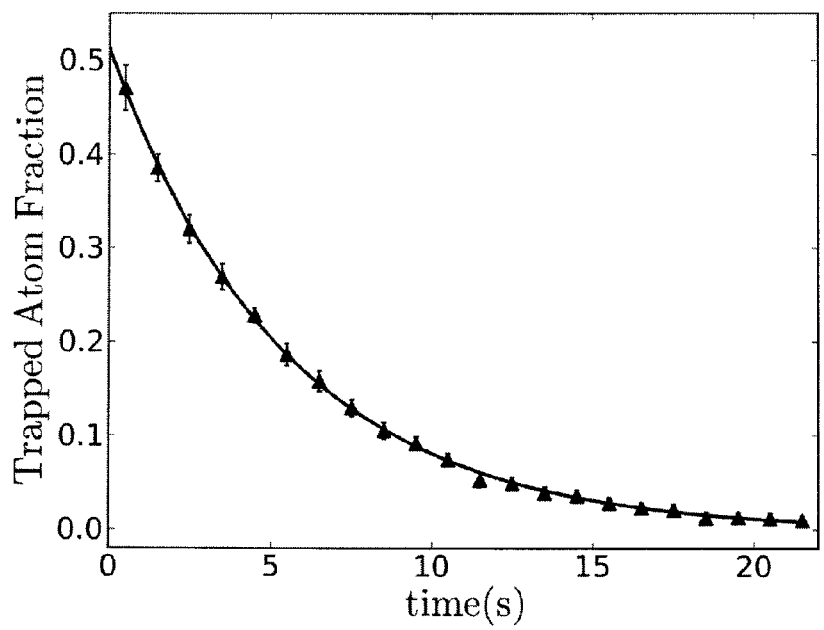
FIG. 2 illustrates the exponential decay of sensor particles confined in a quadrupole magnetic trap as a function of time.

FIG. 2 illustrates pressure measurement results for argon gas, using rubidium $^{87}$Rb sensor particles in a quadrupole magnetic trap. In this example, "cold" and confined $^{87}$Rb atoms are knocked out of the trap when struck by argon gas particles present in the vacuum envelope. On average, the number of sensor particles will decrease according to the exponential decay law: $N(t)=Ae^{\Gamma t}$, where A is the initial number in the trap, gamma, $\Gamma$, is the decay rate, and t is the elapsed time after the sensor source was extinguished and the sensor particles were transferred into the trap.

The average decay rate of sensor particles from the trap (i.e. the value for gamma) is proportional to the number density, n, of the residual gas particles in the vacuum, that is $\Gamma=k\times n$. Therefore the number density (or pressure), n, of the residual gas can be determined from a measurement of the loss rate, $\Gamma$, and a knowledge of the proportionality constant, k, referred to as the loss rate constant. For a single component gas, the gas density is given by $n=\Gamma/k$.

Figure 3:
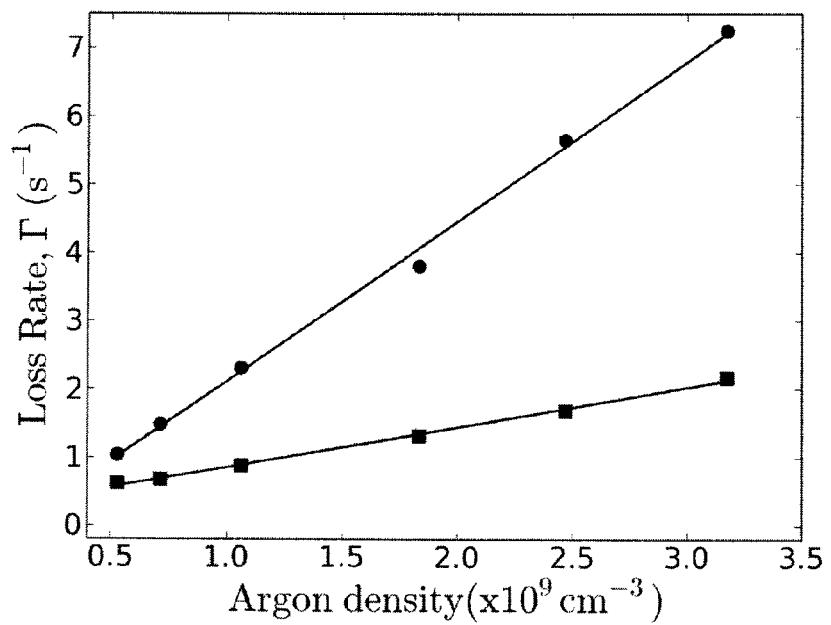
FIG. 3 illustrates the loss rate of trapped rubidium sensor particles versus room temperature argon gas density from a magneto-optic trap (circles) and a magnetic quadrupole trap (squares)

FIG. 3 shows this relationship for argon gas and $^{87}$Rb sensor particles. The sensor particle loss rate, is simply the product of the argon gas density, $n_{Ar}$, and the loss rate constant or velocity averaged cross section $k=(\sigma_{Rb,Ar}\times v_{Ar})$, according to $\Gamma=k\times n_{Ar}$. The loss rate constant, k, for the MOT (i.e. the slope of loss rate as a function of gas density) is much smaller than that for the magnetic trap because the MOT trap depth is much larger than that for the magnetic trap. The argon gas density, $n_{Ar}$, can be determined from a measurement of the sensor particle loss rate, $\Gamma$ and the known loss rate constant: $n_{Ar}=\Gamma/k$.

For the case of multi-component gases, the sensor particle loss rate will follow $\Gamma=k\times n_1+k\times n_2+\ldots$, where $n_i$ is the number density of species i, and $k_i$ is the sensor particle loss rate constant for species i. In general, the dependence of $k_i$ on sensor particle trap depth will be different for each species. By measuring $\Gamma$ at various sensor particle trap depths, a system of equations can be solved to extract the values for $n_i$. The sensitivity depends upon the relative variation of the values $k_i$ with trap depth.

Figure 4:
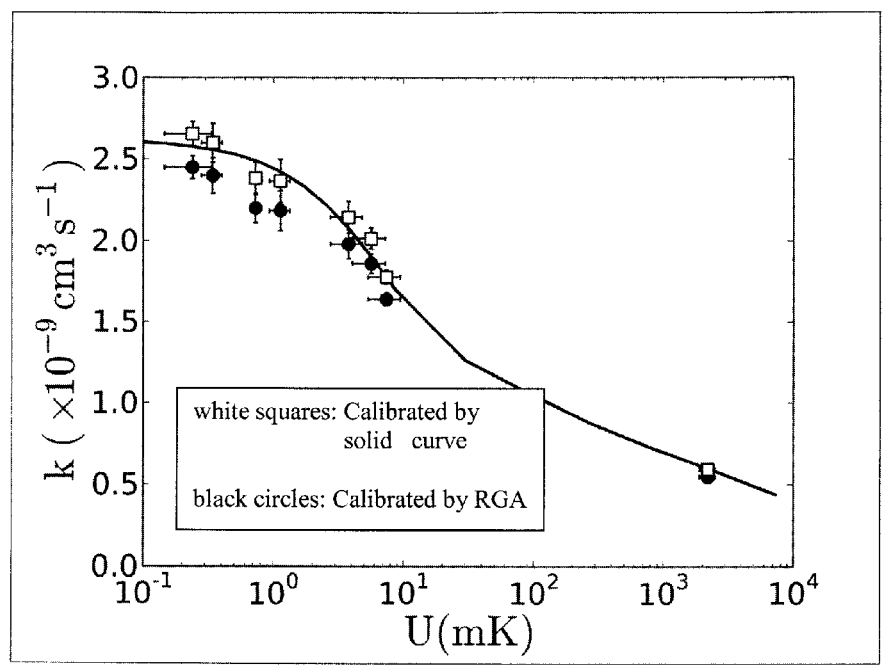
FIG. 4 shows the relationship between rubidium particle loss rate constant, $k=<\sigma v>$, due to elastic collisions with argon as a function of trap depth.

FIG. 4 shows the relationship between the trap depth and the rubidium particle loss rate constant, $k=<\sigma v>$, due to elastic collisions with argon. The particle loss rate constant is shown as the solid line in FIG. 4. This curve is calculated using the known and immutable interaction potentials for Rubidium and Argon and the thermal distribution of the incident flux particles. The dependence of the loss rate constant on trap depth is clearly illustrated. The use of this dependence paired with knowledge of the trap depth is a non-obvious step in this method essential to making an accurate determination of the pressure or flux from loss rate measurements. The measured loss rate of cold $^{87}$Rb sensor atoms from magnetic traps (U<10 mK) and from a MOT (U≈2200 mK) due to a background gas of $^{40}$Ar is shown on the same plot. The solid black circles are loss rate constants calibrated using the argon pressure reading from a commercial residual gas analyzer (RGA). Note that these are systematically lower than the calibration curve based on fundamental atom properties. This demonstrates a systematic shift in the pressure reading from the RGA. This is to be expected since the accuracy of ionization gauges is known to be untrustworthy since it is limited by variations in the sensitivity due to differences in construction, materials, operation and history of the gauge See Stanford Research Systems Application Note IG1BAgasapp.pdf: *Gas Correction Factors for Bayard-Alpert Ionization Gauges*, page 4. For comparison, the loss rate constants, corrected by the calibration curve are shown (white squares). This correction corresponds to an 8% pressure correction to the RGA readings.

The basic methodology for the sensor use is shown schematically in FIG. 5 and includes the following basic steps:

1) Generate a collection of sensor particles and dispense into the vacuum envelope.
2) Cool and trap sensor particles using lasers and a magnetic field to form a magneto optical trap (MOT).
3) For pressures below $10^{-7}$ Torr, transfer cold sensor particles to a magnetic trap or to an optical trap. For higher pressures, keep the atoms confined in the MOT.
4) Introduce ambient gas particles into the vacuum envelope.
5) Measure the loss rate of particles from the trap, $\Gamma$, arising from collisions between trapped sensor particles and ambient gas particles.
6) Determine the ambient gas density (pressure) from $n=\Gamma/k$ Within the scope of the present invention, data acquisition, the lasers, and the current to the coils may preferably be controlled by a computer. As such, the invention can be implemented in numerous ways, including as a process, an apparatus, a system, a computer readable medium such as a computer readable storage medium or a computer network wherein program instructions are sent over optical or communication links. In this specification, these implementations, or any other form that the invention may take, may be referred to as systems or techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

The following discussion provides a brief and general description of a suitable computing environment in which various embodiments of the system may be implemented. Although not required, embodiments will be described in the general context of computer-executable instructions, such as program applications, modules, objects or macros being executed by a computer. Those skilled in the relevant art will appreciate that the invention can be practiced with other computer configurations, including hand-held devices, multiprocessor systems, microprocessor-based or programmable consumer electronics, personal computers ("PCs"), network PCs, mini-computers, mainframe computers, and the like. The embodiments can be practiced in distributed computing environments where tasks or modules are performed by remote processing devices, which are linked through a communications network. In a distributed computing environment, program modules may be located in both local and remote memory storage devices.

A computer system may be used as a server including one or more processing units, system memories, and system buses that couple various system components including system memory to a processing unit. Computers will at times be referred to in the singular herein, but this is not intended to limit the application to a single computing system since in typical embodiments, there will be more than one computing system or other device involved. Other computer systems may be employed, such as conventional and personal computers, where the size or scale of the system allows. The processing unit may be any logic processing unit, such as one or more central processing units ("CPUs"), digital signal processors ("DSPs"), application-specific integrated circuits ("ASICs"), etc. Unless described otherwise, the construction and operation of the various components are of conventional design. As a result, such components need not be described in further detail herein, as they will be understood by those skilled in the relevant art.

A computer system includes a bus, and can employ any known bus structures or architectures, including a memory bus with memory controller, a peripheral bus, and a local bus. The computer system memory may include read-only memory ("ROM") and random access memory ("RAM"). A basic input/output system ("BIOS"), which can form part of the ROM, contains basic routines that help transfer information between elements within the computing system, such as during startup.

The computer system also includes non-volatile memory. The non-volatile memory may take a variety of forms, for example a hard disk drive for reading from and writing to a hard disk, and an optical disk drive and a magnetic disk drive for reading from and writing to removable optical disks and magnetic disks, respectively. The optical disk can be a CD-ROM, while the magnetic disk can be a magnetic floppy disk or diskette. The hard disk drive, optical disk drive and magnetic disk drive communicate with the processing unit via the system bus. The hard disk drive, optical disk drive and magnetic disk drive may include appropriate interfaces or controllers coupled between such drives and the system bus, as is known by those skilled in the relevant art. The drives, and their associated computer-readable media, provide non-volatile storage of computer readable instructions, data structures, program modules and other data for the computing system. Although a computing system may employ hard disks, optical disks and/or magnetic disks, those skilled in the relevant art will appreciate that other types of non-volatile computer-readable media that can store data accessible by a computer system may be employed, such a magnetic cassettes, flash memory cards, digital video disks ("DVD"), Bernoulli cartridges, RAMs, ROMs, smart cards, etc.

Various program modules or application programs and/or data can be stored in the computer memory. For example, the system memory may store an operating system, end user application interfaces, server applications, and one or more application program interfaces ("APIs").

The computer system memory also includes one or more networking applications, for example a Web server application and/or Web client or browser application for permitting the computer to exchange data with sources via the Internet, corporate Intranets, or other networks as described below, as well as with other server applications on server computers such as those further discussed below. The networking application in the preferred embodiment is markup language based, such as hypertext markup language ("HTML"), extensible markup language ("XML") or wireless markup language ("WML"), and operates with markup languages that use syntactically delimited characters added to the data of a document to represent the structure of the document. A number of Web server applications and Web client or browser applications are commercially available, such those available from Mozilla and Microsoft.

The operating system and various applications/modules and/or data can be stored on the hard disk of the hard disk drive, the optical disk of the optical disk drive and/or the magnetic disk of the magnetic disk drive.

A computer system can operate in a networked environment using logical connections to one or more client computers and/or one or more database systems, such as one or more remote computers or networks. A computer may be logically connected to one or more client computers and/or database systems under any known method of permitting computers to communicate, for example through a network such as a local area network ("LAN") and/or a wide area network ("WAN") including, for example, the Internet. Such networking environments are well known including wired and wireless enterprise-wide computer networks, intranets, extranets, and the Internet. Other embodiments include other types of communication networks such as telecommunications networks, cellular networks, paging networks, and other mobile networks. The information sent or received via the communications channel may, or may not be encrypted. When used in a LAN networking environment, a computer is connected to the LAN through an adapter or network interface card (communicatively linked to the system bus). When used in a WAN networking environment, a computer may include an interface and modem or other device, such as a network interface card, for establishing communications over the WAN/Internet.

In a networked environment, program modules, application programs, or data, or portions thereof, can be stored in a computer for provision to the networked computers. In one embodiment, the computer is communicatively linked through a network with TCP/IP middle layer network protocols; however, other similar network protocol layers are used in other embodiments, such as user datagram protocol ("UDP"). Those skilled in the relevant art will readily recognize that these network connections are only some examples of establishing communications links between computers, and other links may be used, including wireless links.

While in most instances a computer will operate automatically, where an end user application interface is provided, a user can enter commands and information into the computer through a user application interface including input devices, such as a keyboard, and a pointing device, such as a mouse. Other input devices can include a microphone, joystick, scanner, etc. These and other input devices are connected to the processing unit through the user application interface, such as a serial port interface that couples to the system bus, although other interfaces, such as a parallel port, a game port, or a wireless interface, or a universal serial bus ("USB") can be used. A monitor or other display device is coupled to the bus via a video interface, such as a video adapter (not shown). The computer can include other output devices, such as speakers, printers, etc.

It is to be fully understood that the present methods, systems and devices also may be implemented as a computer program product that comprises a computer program mechanism embedded in a computer readable storage medium. For instance, the computer program product could contain program modules. These program modules may be stored on CD-ROM, DVD, magnetic disk storage product, flash media or any other computer readable data or program storage product. The software modules in the computer program product may also be distributed electronically, via the Internet or otherwise, by transmission of a data signal (in which the software modules are embedded) such as embodied in a carrier wave.

For instance, the foregoing detailed description has set forth various embodiments of the devices and/or processes via the use of examples. Insofar as such examples contain one or more functions and/or operations, it will be understood by those skilled in the art that each function and/or operation within such examples can be implemented, individually and/or collectively, by a wide range of hardware, software, firmware, or virtually any combination thereof. In one embodiment, the present subject matter may be implemented via ASICs. However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that the mechanisms taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, flash drives and computer memory; and transmission type media such as digital and analog communication links using TDM or IP based communication links (e.g., packet links).

While the form of apparatus described herein constitutes a preferred embodiment of this invention, it is to be understood that the invention is not limited to this precise form of apparatus. As will be apparent to those skilled in the art, the various embodiments described above can be combined to provide further embodiments. Aspects of the present systems, methods and components can be modified, if necessary, to employ systems, methods, components and concepts to provide yet further embodiments of the invention. For example, the various methods described above may omit some acts, include other acts, and/or execute acts in a different order than set out in the illustrated embodiments.

Further, in the methods taught herein, the various acts may be performed in a different order than that illustrated and described. Additionally, the methods can omit some acts, and/or employ additional acts.

These and other changes can be made to the present systems, methods and articles in light of the above description. In general, in the following claims, the terms used should not be construed to limit the invention to the specific embodiments disclosed in the specification and the claims, but should be construed to include all possible embodiments along with the full scope of equivalents to which such claims are entitled. Accordingly, the invention is not limited by the disclosure, but instead its scope is to be determined entirely by the following claims.

What is claimed is:

1. An apparatus which comprises:
   a) a sensor vacuum envelope;
   b) a means to introduce at least one sensor particle;
   c) a means to introduce said at least one sensor particle into the vacuum envelope;
   d) a means to cool and localize said at least one sensor particle;
   e) a means to transfer said at least one sensor particle into a sensor volume;
   f) a means to introduce particles to be measured into said vacuum envelope such that said particles to be measured interact with said at least one sensor particle;
   g) a means to measure a loss rate of said at least one sensor particle from the sensor volume;
   h) a means to determine trap depths at which the loss rate of said at least one sensor particle is measured;
   i) a means to determine a loss rate constant of said at least one sensor particle at known trap depths; and
   j) a means to determine incident particle flux based on said loss rate of said at least one sensor particle and said loss rate constant of said at least one sensor particle.

2. Apparatus according to claim 1, wherein said sensor vacuum envelope is integrated together with the vacuum envelope under test.

3. Apparatus according to claim 1, wherein said at least one sensor particle is an alkali-metal atom selected from the group consisting of lithium, sodium, potassium, rubidium, or cesium atoms.

4. Apparatus according to claim 1, wherein said at least one sensor particle is introduced into the sensor volume by the use of an alkali-metal vaporizer to provide an alkali-metal vapor inside said sensor volume.

5. Apparatus according to claim 1, wherein said means to cool and localize said at least one sensor particle further comprises a magneto-optic trap (MOT), comprising:
   a) a laser system and associated optics capable of delivering cooling radiation sufficient to Doppler cool said at least one sensor particle;
   b) a set of magnetic coils or permanent magnets arranged to provide a magnetic field gradient sufficient to complete the operation of the MOT providing both cooling and spatial confinement of said at least one sensor particle.

6. Apparatus according to claim 1 arranged such that said at least one sensor particle is transferred into a spatially localized sensor volume determined by a magnetic, electric, or electro-magnetic field generated by either a) a set of magnetic coils or a permanent magnet system in a proper arrangement to provide a magnetic field gradient sufficiently large to localize said at least one sensor particle to the sensor volume; or b) a laser system capable of delivering radiation sufficient to localize said at least one sensor particle to the sensor volume.

7. Apparatus according to claim 1 arranged such that said particles to be measured are allowed, by means of a vacuum valve, to enter into and impinge upon the sensor volume such that said particles to be measured interact with said at least one sensor particle.

8. Apparatus according to claim 1 arranged such that a number of said at least one sensor particle inside the sensor volume is measured by a fluorescence detection device comprising;

a) a photodiode, photodetector, CCD camera, or CMOS camera; and b) a laser system and associated optics capable of delivering excitation radiation and collecting resulting fluorescence of said at least one sensor particle.

9. Apparatus of claim 5 wherein said laser system is arranged to provide near resonant light sufficient to excite said at least one sensor particle so that fluorescence of said at least one sensor particle is detectable.

10. Apparatus according to claim 1, including a computer or electronic system to control and monitor said at least one sensor particle in the sensor volume.

11. The apparatus according to claim 1, wherein the particles to be measured comprise atoms or molecules.

12. The apparatus according to claim 1, wherein the said at least one sensor particle is comprised of either atoms or molecules.

13. The apparatus according to claim 1, further comprising a means to determine, from the determined incident particle flux, a corresponding ambient density and corresponding pressure of said particles to be measured.

14. The apparatus according to claim 6, arranged to localize said at least one sensor particle in the sensor volume using any combination of the electric, magnetic, and electro-magnetic fields.

15. A method for measuring the incident flux of particles in a vacuum environment, comprising:

a) introducing at least one sensor particle into the test vacuum environment and a sensor volume;

b) collecting and confining said at least one sensor particle inside the sensor volume;

c) introducing a particle flux to be measured into the sensor volume;

d) monitoring characteristics of said at least one sensor particle selected from the group consisting of a number of said at least one sensor particle and an internal state of said at least one sensor particle, within the sensor volume during a measurement time;

e) measuring a rate of change of said characteristics of said at least one sensor particle;

f) determining a sensor volume environment in which the rate of change of said characteristics of said at least one sensor particle is measured, the sensor volume environment being selected from the group consisting of electric, magnetic or electromagnetic fields of the sensor volume and trap depth of said at least one sensor particle;

g) determining a rate-of-change constant of said characteristics of said at least one sensor particle for a state of said at least one sensor particle state and for the sensor volume environment;

h) determining the incident flux based on the measured rate of change of said characteristic of said at least one sensor particle, the determined sensor volume environment, and the determined rate-of-change constant of said characteristic of said at least one sensor particle.

16. A method according to claim 15, further comprising introducing said at least one sensor particle is into said sensor volume at a controlled rate such that said at least one sensor particle can be collected, cooled, and confined in a magneto-optic trap and transferred to the sensor volume environment.

17. A method according to claim 15, further comprising temporarily isolating said at least one sensor particle in the sensor volume from a source of said at least one sensor particle and allowing said at least one sensor particle to interact with the particles to be measured.

18. A method according to claim 15, further comprising measuring the characteristics of said at least one sensor particle by detecting intensity of resonance fluorescence from said at least one sensor particle during the measurement time or measured at the beginning and at the end of the measurement time.

19. A method according to claim 15, further comprising determining the particle flux through the sensor volume from the change in the number or the internal state of any sensor particle remaining in the sensor volume, comprising:

a) measuring the loss rate of or rate of change of the internal state of said at least one sensor particle in the sensor volume under different confinement conditions comprising different sensor volume environments including the trap depth for said at least one sensor particle;

b) dividing the measured loss rate of or the rate of change of the internal state of said at least one sensor particle by the rate-of-change constant for the corresponding sensor volume environment, a type of said at least one sensor particle, and a particle species being measured; and c) inverting a set of linear equations for an expected loss rate or a rate of internal state change under different sensor volume environmental conditions given an incident particle flux comprised of a collection of different particle species.

20. The apparatus according to claim 15, wherein the internal state of said at least one sensor particle is a momentum or a velocity of the sensor particle.

21. The apparatus according to claim 15, wherein the internal state of said at least one sensor particle is one or more of an electronic orbital, an electronic spin, and a nuclear spin angular momentum of said at least one sensor particle.

\* \* \* \* \*